(12) United States Patent
Lu et al.

(10) Patent No.: US 6,909,300 B2
(45) Date of Patent: Jun. 21, 2005

(54) METHOD FOR FABRICATING MICROELECTRONIC FABRICATION ELECTRICAL TEST APPARATUS ELECTRICAL PROBE TIP HAVING POINTED TIPS

(75) Inventors: Nai-Cheng Lu, Hsinchu (TW); Yu-Ting Liao, Hsinchu (TW); Fu-Sung Liu, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 55 days.

(21) Appl. No.: 10/143,412

(22) Filed: May 9, 2002

(65) Prior Publication Data

US 2003/0210065 A1 Nov. 13, 2003

(51) Int. Cl.$^7$ ............................................... G01R 31/26
(52) U.S. Cl. ........................ 324/761; 324/754; 324/765
(58) Field of Search ................................. 324/754, 755, 324/761–762, 765; 29/842–852; 438/14–18; 439/482

(56) References Cited

U.S. PATENT DOCUMENTS

| | | | | |
|---|---|---|---|---|
| 5,177,439 A | * | 1/1993 | Liu et al. ..................... 324/754 |
| 5,483,741 A | * | 1/1996 | Akram et al. ................. 29/846 |
| 5,759,906 A | * | 6/1998 | Lou ............................ 438/623 |
| 5,763,879 A | | 6/1998 | Zimmer et al. |
| 5,982,185 A | * | 11/1999 | Farnworth .................. 324/755 |
| 6,121,784 A | | 9/2000 | Montoya |
| 6,208,155 B1 | | 3/2001 | Barabi et al. |
| 6,355,580 B1 | * | 3/2002 | Li et al. ..................... 438/788 |

* cited by examiner

*Primary Examiner*—Vinh P. Nguyen
(74) *Attorney, Agent, or Firm*—Tung & Associates

(57) ABSTRACT

A method for fabricating an electrical test apparatus electrical probe tip first provides a probe tip substrate having a topographic surface. A high density plasma chemical vapor deposition (HDP-CVD) deposited mandrel layer is then formed upon the topographic surface. It has a series of pointed tips formed over a series of topographic features within the topographic surface. Finally, a conductor probe tip layer is formed conformally upon the high density plasma chemical vapor deposition (HDP-CVD) deposited mandrel layer and replicating the series of pointed tips. Due to the series of pointed tips and the series of replicated pointed tips, a microelectronic fabrication when tested with the electrical test apparatus electrical probe tip is tested with enhanced accuracy.

23 Claims, 2 Drawing Sheets

METHOD FOR FABRICATING MICROELECTRONIC FABRICATION ELECTRICAL TEST APPARATUS ELECTRICAL PROBE TIP HAVING POINTED TIPS

BACKGROUND OF THE INVENTION

1. Field of the Invention

The present invention relates generally to methods for fabricating microelectronic fabrication electrical test apparatus electrical probe tips. More particularly, the present invention relates to methods for fabricating, with enhanced efficiency, microelectronic fabrication electrical test apparatus electrical probe tips.

2. Description of the Related Art

Microelectronic fabrications are formed from microelectronic substrates over which are formed patterned microelectronic conductor layers which are separated by microelectronic dielectric layers.

Incident to the fabrication of various types of microelectronic fabrications within the art of microelectronic fabrication, it is common in the art of microelectronic fabrication to electrically test microelectronic fabrications to assure proper and functional operation of the microelectronic fabrications.

While electrical testing of microelectronic fabrications to assure proper and functional operation of microelectronic fabrications is common in the art of microelectronic fabrication, electrical testing of microelectronic fabrications to assure proper and functional operation of microelectronic fabrications is nonetheless not entirely without problems in the art of microelectronic fabrication. In that regard, it is often difficult in the art of microelectronic fabrication when electrical probe tip contact testing microelectronic fabrications within the art of microelectronic fabrication to provide adequate electrical probe tip contact to a microelectronic fabrication when electrical probe tip contact testing the microelectronic fabrication. As is understood by a person skilled in the art, inadequate electrical probe tip contact to a microelectronic fabrication when electrical probe tip contact testing the microelectronic fabrication is undesirable in the art of microelectronic fabrication insofar as such inadequate electrical probe tip contact often provides inaccurate electrical test results when electrical probe tip contact testing a microelectronic fabrication.

It is thus desirable in the art of microelectronic fabrication to provide methods and apparatus for more accurately electrical probe tip contact testing microelectronic fabrications.

It is towards the foregoing object that the present invention is directed.

Various methods and apparatus have been disclosed in the art of microelectronic fabrication for electrically testing, with desirable properties, microelectronic fabrications.

Included among the methods and apparatus, but not limiting among the methods and apparatus, are methods and apparatus disclosed within: (1) Zimmer et al., in U.S. Pat. No. 5,763,879 (an electrical test apparatus for electrically testing, with enhanced accuracy, a microelectronic fabrication, by forming upon an electrical probe tip employed within the electrical test apparatus a polycrystalline diamond coating); (2) Montoya, in U.S. Pat. No. 6,121,784 (an electrical test apparatus and method for use thereof which provides reduced damage to a microelectronic fabrication tested with the electrical test apparatus, by employing within the electrical test apparatus an electrical probe tip assembled with a specific geometric disposition with respect to the microelectronic fabrication); and (3) Barabi et al., in U.S. Pat. No. 6,208,155 (an electrical test apparatus and method for use thereof which provides reduced damage to a solder ball within a ball grid array (BGA) microelectronic fabrication which is electrically tested with the electrical test apparatus, by employing within the electrical test apparatus an electrical probe tip shaped as a truncated cup which contacts the solder ball within the ball grid array (BGA) microelectronic fabrication).

Desirable in the art of microelectronic fabrication are additional methods and apparatus which may be employed within the art of microelectronic fabrication for electrically testing, with enhanced accuracy, microelectronic fabrications.

It is towards the foregoing object that the present invention is directed.

SUMMARY OF THE INVENTION

A first object of the present invention is to provide an electrical test apparatus for electrically testing a microelectronic fabrication.

A second object of the present invention is to provide an electrical test apparatus in accord with the first object of the present invention, wherein the microelectronic fabrication is tested with enhanced accuracy.

A third object of the present invention is to provide an electrical test apparatus in accord with the first object of the present invention and the second object of the present invention, wherein the electrical test apparatus is readily commercially fabricated.

In accord with the objects of the present invention, there is provided by the present invention an electrical probe tip for use within an electrical test apparatus for testing a microelectronic fabrication, a method for fabricating the electrical probe tip for use within the electrical test apparatus for electrically testing the microelectronic fabrication and a method for testing the microelectronic fabrication while employing the electrical probe tip.

To practice a preferred embodiment of the method for fabricating the electrical probe tip, there is first provided an electrical probe tip substrate comprising a topographic surface. There is then formed upon the topographic surface a high density plasma chemical vapor deposition (HDP-CVD) deposited mandrel layer having formed therein a series of pointed tips formed upon and corresponding with a series of topographic features within the topographic surface. Finally, there is then formed conformally upon the high density plasma chemical vapor deposition (HDP-CVD) deposited mandrel layer, and replicating the series of pointed tips, a conductor probe tip layer.

Within the foregoing method, and under circumstances where the high density plasma chemical vapor deposition (HDP-CVD) deposited mandrel layer may be formed of a conductor material, a conductor probe tip layer may not be needed and thus may be omitted.

Similarly, the method for fabricating the electrical probe tip in accord with the present invention contemplates the electrical probe tip fabricated in accord with the method and the method for testing the microelectronic fabrication while employing the electrical probe tip.

The present invention provides an electrical test apparatus for electrically testing a microelectronic fabrication, wherein the microelectronic fabrication is tested with enhanced accuracy.

The present invention realizes the foregoing object with respect to an electrical probe tip employed within the electrical test apparatus, by fabricating the electrical probe tip (with enhanced precision) with a high density plasma chemical vapor deposition (HDP-CVD) deposited mandrel layer having formed therein (with enhanced precision) a series of pointed tips, such that a conductor probe tip layer formed conformally upon the high density plasma chemical vapor deposition (HDP-CVD) deposited mandrel layer replicates the series of pointed tips. In turn the series of replicated pointed tips provides for enhanced contact and enhanced accuracy when electrically testing a microelectronic fabrication while employing an electrical test apparatus having assembled therein the electrical probe tip of the present invention.

The electrical probe apparatus of the present invention is readily commercially fabricated.

An electrical probe tip in accord with the present invention, for use within an electrical test apparatus, may be fabricated employing methods and materials as are otherwise generally known in the art of microelectronic fabrication, but employed within the context of a specific application to provide the electrical probe tip in accord with the present invention. Since it is thus at least in part a novel application of methods and materials which provides at least in part the present invention, rather than the existence of methods and materials which provides the present invention, an electrical probe apparatus having assembled therein an electrical probe tip in accord with the present invention is readily commercially fabricated.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides an electrical test apparatus for electrically testing a microelectronic fabrication, wherein the microelectronic fabrication is tested with enhanced accuracy.

The present invention realizes the foregoing object with respect to an electrical probe tip employed within the electrical test apparatus, by fabricating the electrical probe tip with a high density plasma chemical vapor deposition (HDP-CVD) deposited mandrel layer having formed therein a series of pointed tips, such that a conductor probe tip layer formed upon the high density plasma chemical vapor deposition (HDP-CVD) deposited mandrel layer replicates the series of pointed tips. In turn the series of replicated pointed tips provides for enhanced contact and enhanced accuracy when electrically testing a microelectronic fabrication while employing an electrical test apparatus having assembled therein the electrical probe tip.

Referring now to FIG. 1 to FIG. 5, there is shown a series of schematic cross-sectional diagrams illustrating the results of progressive stages of fabricating, in accord with a preferred embodiment of the present invention, an electrical test apparatus electrical probe tip in accord with the present invention.

Figure 1:
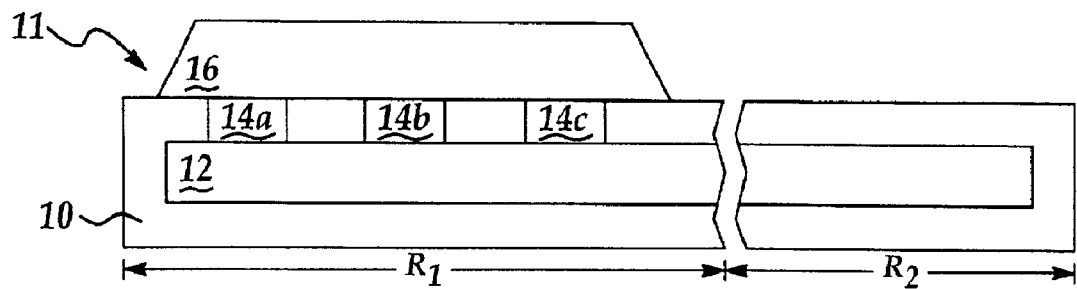
FIG. 1, FIG. 2, FIG. 3, FIG. 4 and FIG. 5 show a series of schematic cross-sectional diagrams illustrating the results of progressive stages of fabricating, in accord with a preferred embodiment of the present invention, an electrical test apparatus electrical probe tip in accord with the present invention.

Shown in FIG. 1 is a schematic cross-sectional diagram of the electrical test apparatus electrical probe tip at an early stage in its fabrication in accord with the preferred embodiment of the present invention.

Shown in FIG. 1, in a first instance, is an electrical test apparatus electrical probe tip substrate 11 comprising in a first instance an insulator substrate 10 having formed therein a conductor bus layer 12 (i.e., the conductor bus layer 12 is embedded within the insulator substrate 10). Similarly, there is also shown within the schematic cross-sectional diagram of FIG. 1, and formed electrically connected to the conductor bus layer 12, a series of conductor interconnect stud layers 14a, 14b and 14c, and further formed electrically connected to the series of conductor interconnect stud layers 14a, 14b and 14c a patterned conductor spacer layer 16. Finally, as is also illustrated within the schematic cross-sectional diagram of FIG. 1, the electrical test apparatus electrical probe tip substrate 11 comprises a probe tip region R1 of the electrical test apparatus electrical probe tip substrate 11 and an apparatus connection region R2 of the electrical test apparatus electrical probe tip substrate 11.

Within the preferred embodiment of the present invention with respect to the insulator substrate 10, the insulator substrate 10 is typically and preferably formed of an insulator material as is otherwise generally conventional in the art of microelectronic fabrication, and will typically and preferably be formed of an insulator material having adequate structural integrity and rigidity to form therefrom an electrical probe tip. Typically and preferably, but not exclusively, the insulator substrate 10 is formed of a ceramic material, (such as but not limited to a silicon oxide containing ceramic material, an aluminum oxide containing ceramic material or a zirconium oxide containing ceramic material, formed to a thickness of from about 0.1 to about 0.2 millimeters, a length of from about 1 to about $10^3$ millimeters and a width of from about 1 to about $10^3$ millimeters, and having formed therein the conductor bus layer 12. Alternatively, the insulator substrate 10 may be formed at least in part of a silicon substrate or a silicon semiconductor substrate of the foregoing dimensions, having additional appropriate insulator layers formed therein.

Within the preferred embodiment of the present invention with respect to the conductor bus layer 12, the series of conductor interconnect stud layers 14a, 14b and 14c and the patterned conductor spacer layer 16, each of the conductor bus layer 12, the series of conductor interconnect stud layers 14a, 14b and 14c and the patterned conductor spacer layer 16 are each formed of a conductor material as is otherwise generally conventional in the art of electrical test apparatus electrical probe tip fabrication, which will typically include, but are not limited to, aluminum, aluminum alloys, copper, copper alloys.

Typically and preferably, the conductor bus layer 12 is formed to a thickness of from about 6000 to about 8000 angstroms formed within the insulator substrate 10. Typically and preferably, the series of conductor interconnect stud layers 14a, 14b and 14c is formed to a thickness of from about 4000 to about 5000 angstroms to reach through the insulator substrate 10 and contact the conductor bus layer 12. Typically and preferably, the patterned conductor spacer layer 16 is formed to a thickness of from about 3000 to about 5000 angstroms, a length of from about 50000 to about 60000 angstroms and a width of from about $5 \times 10^5$ to about $6 \times 10^5$ angstroms, such as to provide a raised surface within the probe tip region R1 of the electrical test apparatus electrical probe tip substrate 11 with respect to the apparatus connection region R2 of the electrical test apparatus electrical probe tip substrate 11.

Figure 2:
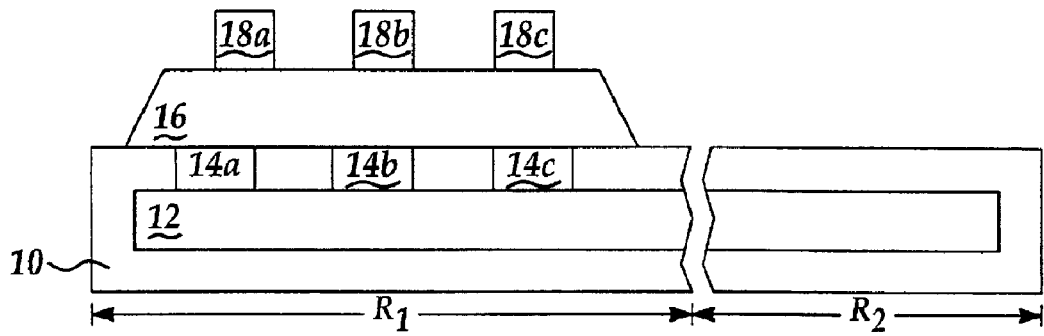

Referring now to FIG. 2, there is shown a schematic cross-sectional diagram illustrating the results of further processing of the electrical test apparatus electrical probe tip substrate whose schematic cross-sectional diagram is illustrated in FIG. 1.

Shown in FIG. 2 is a schematic cross-sectional diagram of an electrical test apparatus electrical probe tip substrate otherwise equivalent to the electrical test apparatus electrical probe tip substrate whose schematic cross-sectional diagram is illustrated in FIG. 1, but wherein there is formed upon the patterned conductor spacer layer 16 a series of patterned layers 18a, 18b, 18c, to thus form within the electrical test apparatus electrical probe tip substrate a topographic surface. In FIG. 2, each of the series of patterned layers 18a, 18b and 18c has a flat too to provide a series of flat topped topographic features. Within the present invention an alternative topographic substrate may also be formed by etching appropriately dimensioned pits into the patterned conductor spacer layer 16, rather than forming additional patterned layers upon the patterned conductor spacer layer 16. Within the present invention and the preferred embodiment of the present invention, the series of patterned layers 18a, 18b and 18c (and additional patterned layers formed perpendicularly thereto such as to form in plan view of the patterned conductor spacer layer 16 a bi-directional array of patterned layers) is farmed of appropriate dimensions and spacings such that when a high density plasma chemical vapor deposition (HDP-CVD) deposited mandrel layer is formed upon the series of patterned layers 18a, 18b and 18c the high density plasma chemical vapor deposition (HDP-CVD) deposited mandrel layer is formed with a series of pointed tips aligned with each of the series of patterned layers 18a, 18b and 18c. The formation of such a series of pointed tips is a generally inherent feature of high density plasma chemical vapor deposition (HDP-CVD) methods, particularly when a deposition rate to sputtering rate ratio within a high density plasma chemical vapor deposition (HDP-CVD) method is adjusted to a range of from about 2:5 to about 3:1. As is understood by a person skilled in the art, high density plasma chemical vapor deposition (HDP-CVD) methods are simultaneous chemical vapor deposition (CVD) and bias sputtering methods which are generally employed for forming densified layers, and in particular densified dielectric layers, within microelectronic fabrications.

Thus, within the preferred embodiment of the present invention, each of the series of patterned layers 18a, 18b and 18c is formed of: (1) a thickness of from about 1 to about 1E10 angstroms and more preferable from about 5000 to about 6000 angstroms, (2) a bidirectional (plan view) linewidth of from about 1 to about 1E20 microns and more preferably of from about 0.8 to about 1.0 microns and (3) a separation distance from an adjacent patterned layer of from about 1 to about 1E20 microns and more preferably of from about 3 to about 5 microns. The series of patterned layers 18a, 18b and 18c may be formed of any of several projected geometric shapes, both regular and irregular projected geometric shapes, with square projected geometric shapes and circular projected geometric shapes being most common.

Finally, although the series of patterned layers 18a, 18b and 18c may be formed employing any of several materials, including but not limited to conductor materials, semiconductor materials and dielectric materials, for the preferred embodiment of the present invention, the series of patterned layers 18a, 18b and 18c is typically and preferably formed of a dielectric material, which is generally most readily patterned to form the series of patterned layers 18a, 18b and 18c of the foregoing dimensions.

Figure 3:
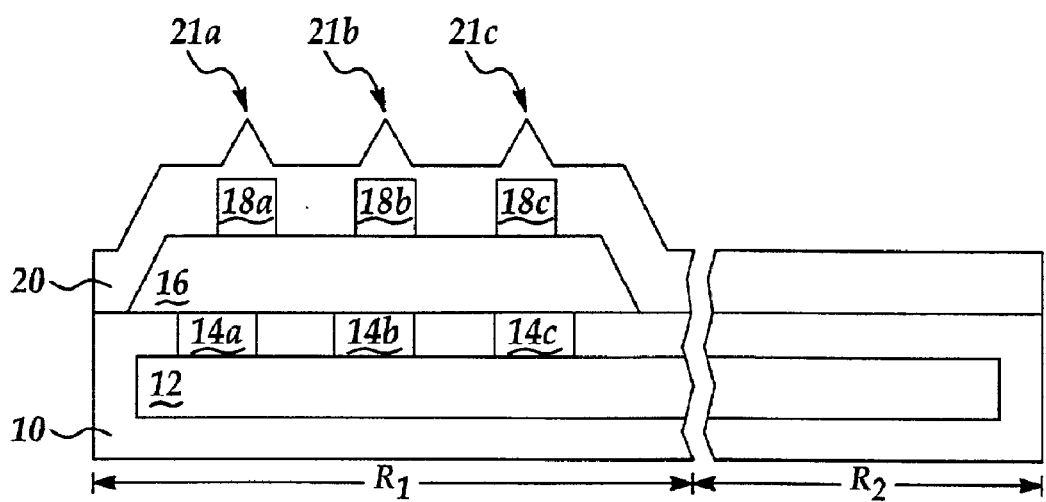

Referring now to FIG. 3, there is shown a schematic cross-sectional diagram illustrating the results of further processing of the electrical test apparatus electrical probe tip whose schematic cross-sectional diagram is illustrated in FIG. 2.

Shown in FIG. 3 is a schematic cross-sectional diagram of an electrical test apparatus electrical probe tip otherwise equivalent to the electrical test apparatus electrical probe tip whose schematic cross-sectional diagram is illustrated in FIG. 2, but wherein there is formed over the electrical test apparatus electrical probe tip substrate 11 as illustrated within the schematic cross-sectional diagram of FIG. 1, including the series of patterned layers 18a, 18b and 18c as illustrated in FIG. 2, a blanket high density plasma chemical vapor deposition (HDP-CVD) deposited mandrel layer 20 which has a series of pointed tips 21a, 21b and 21c formed therein and corresponding with the series of patterned layers 18a, 18b and 18c.

Within the preferred embodiment of the present invention, the high density plasma chemical vapor deposition deposited mandrel layer 20 is typically and preferably formed of a silicon oxide material, as is otherwise more generally conventionally formed within the art of microelectronic fabrication while employing the high density plasma chemical vapor deposition (HDP-CVD) method. However, the present invention does not preclude the high density plasma chemical vapor deposition (HDP-CVD) deposited mandrel layer from being formed from materials including but not limited to conductor materials, semiconductor materials and dielectric materials, provided that the materials may be deposited employing a chemical vapor deposition (CVD) method with an attendant bias sputtering. Under circumstances where the high density plasma chemical vapor deposition (HDP-CVD) deposited mandrel layer 20 is formed of a conductor material, and in particular of a mechanically hard conductor material, there may not necessarily be a need for additional processing of the electrical test apparatus electrical probe tip substrate whose schematic cross-sectional diagram is illustrated in FIG. 3 to form therefrom a functional electrical test apparatus electrical probe tip.

Typically and preferably, the high density plasma chemical vapor deposition deposited mandrel layer 20 is formed to a thickness of from about 1 to about 1E10 angstroms and more preferably of from about 5000 to about 10000 angstroms with the series of pointed tips 21a, 21b and 21c rising above underlying plateaus centered therebeneath by a height of from about 1 to about 1E10 angstroms and more preferably of from 5000 to about 10000 angstroms, and where adjacent pointed tips within a bidirectional (plan view) array of pointed tips including the series of pointed tips 21a, 21b and 21c are separated by a separation distance of from about 1 to about 1E20 microns and more preferably of from about 3 to about 10 microns.

Figure 4:
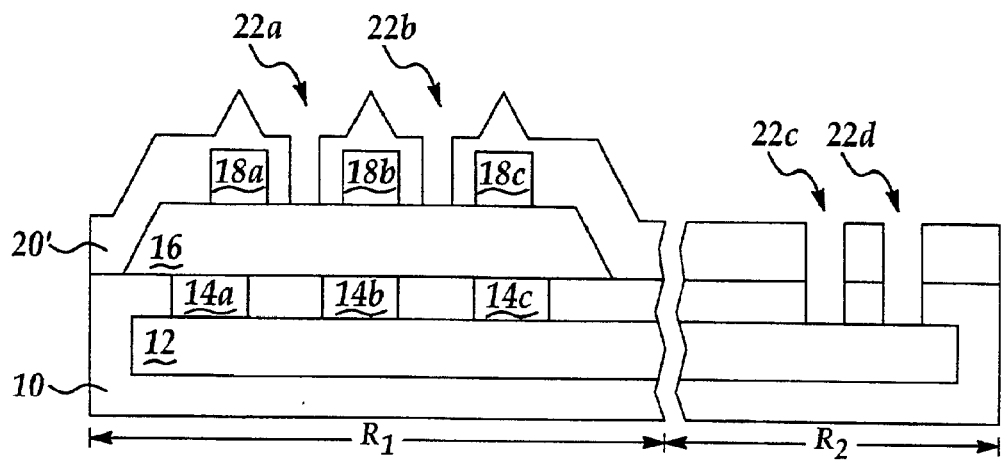

Referring now to FIG. 4, there is shown a schematic cross-sectional diagram illustrating the results of further processing of the electrical test apparatus electrical probe tip substrate whose schematic cross-sectional diagram is illustrated in FIG. 3.

Shown in FIG. 4 is a schematic cross-sectional diagram of an electrical test apparatus electrical probe tip substrate otherwise equivalent to the electrical test apparatus electrical probe tip substrate whose schematic cross-sectional diagram is illustrated in FIG. 3, but wherein there is formed a series of vias 22a, 22b, 22c and 22d, at least in part through the high density plasma chemical vapor deposition (HDP-CVD) deposited mandrel layer 20 to form therefrom a patterned high density plasma chemical vapor deposition (HDP-CVD) deposited mandrel layer 20'. Within the preferred embodiment of the present invention, a first pair of vias 22a and 22b reaches the patterned conductor spacer layer 16, while a second pair of vias 22c and 22d reaches the conductor bus layer 12 while additionally also penetrating through a portion of the insulator substrate 10.

Within the preferred embodiment of the present invention, the series of vias 22a, 22b, 22c and 22d may be formed employing etch methods and etch materials as are otherwise generally conventional in the art of microelectronic fabrication, which will typically and preferably include reactive ion etch (RIE) plasma etch methods and reactive ion etch (RIE) plasma etch materials.

Figure 5:
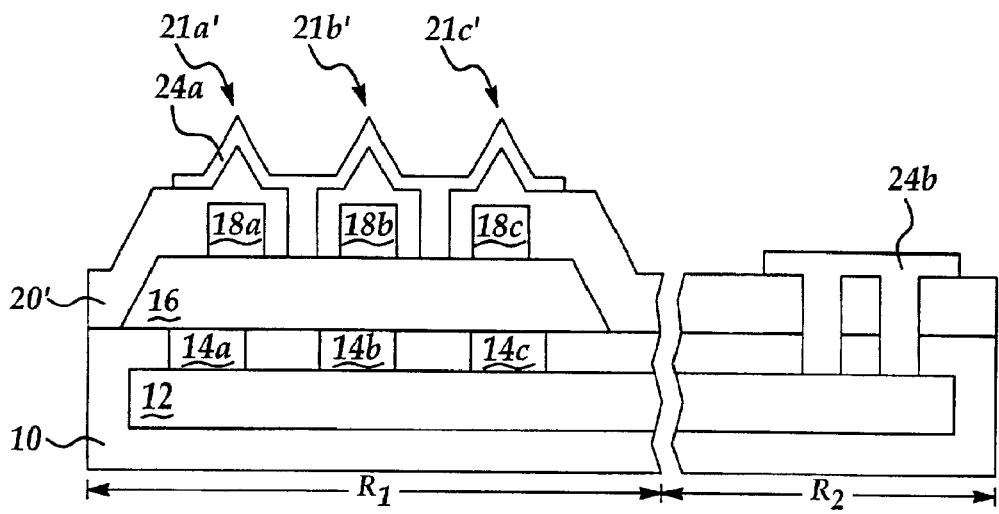

Referring now to FIG. 5, there is shown a schematic cross-sectional diagram illustrating the results of further processing of the electrical test apparatus electrical probe tip substrate whose schematic cross-sectional diagram is illustrated in FIG. 4.

Shown in FIG. 5 is a schematic cross-sectional diagram of an electrical test apparatus electrical probe tip substrate otherwise equivalent to the electrical test apparatus electrical probe tip substrate whose schematic cross-sectional diagram is illustrated in FIG. 3, but wherein there is formed upon the patterned high density plasma chemical vapor deposition (HDP-CVD) deposited mandrel layer 20' within the probe tip region R1 of the electrical test apparatus electrical probe tip substrate a patterned conductor probe tip layer 24a which reaches the patterned conductor spacer layer 16 and formed within the apparatus connection region R2 of the electrical test apparatus electrical probe tip substrate a patterned conductor interconnect layer 24b which reaches the conductor bus layer 12 and thus provides electrical continuity with respect to the patterned conductor probe tip layer 24a. Within the preferred embodiment of the present invention, the patterned conductor probe tip layer 24a replicates the series of pointed tips 21a, 21b and 21c within the patterned high density plasma chemical vapor deposition (HDP-CVD) deposited mandrel layer to form a series of replicated pointed tips 21a', 21b' and 21c'.

Within the preferred embodiment of the present invention, each of the patterned conductor probe tip layer 24a and the patterned conductor interconnect layer 24b is formed employing methods and conductor materials as are otherwise generally conventional in the art of microelectronic fabrication, but in particular formed of conductor materials which in general have an enhanced hardness such as to provide enhanced wear characteristics of an electrical test apparatus electrical probe tip in accord with the present invention.

Thus, although each of the patterned conductor probe tip layer 24a and the patterned conductor interconnect layer 24b may be formed employing any of several conductor materials as are conventional in the art of microelectronic fabrication, including but not limited to aluminum, aluminum alloys, copper, copper alloys, refractory metals and refractory metal alloys, for the preferred embodiment of the present invention, each of the patterned conductor probe tip layer 24a and the patterned conductor interconnect layer 24b is typically and preferably formed of a refractory metal or refractory metal alloy conductor material, such as but not limited to a tungsten metal or tungsten metal alloy refractory metal conductor material, which generally provides enhanced hardness.

Typically and preferably, each of the patterned conductor probe tip layer 24a and the patterned conductor interconnect layer 24b is formed to a thickness of from about 10 to about 10E5 angstroms and more preferably of from about 5000 to about 10000 angstroms.

Figure 6:
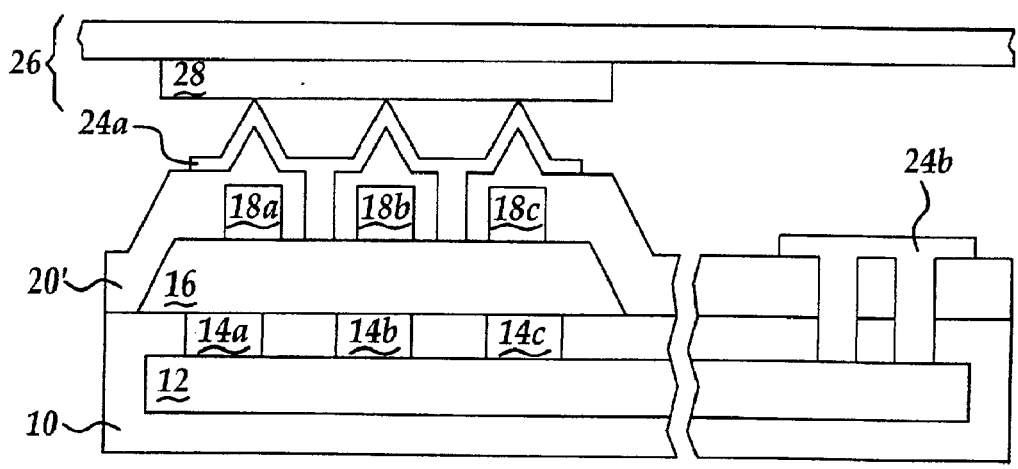
FIG. 6 shows a schematic cross-sectional diagram illustrating use of the electrical test apparatus electrical probe tip in accord with the present invention, for electrically testing a microelectronic fabrication.

Referring now to FIG. 6, there is shown a schematic cross-sectional diagram illustrating operation of the electrical test apparatus electrical probe tip of the present invention in testing a microelectronic fabrication.

As is illustrated within the schematic cross-sectional diagram of FIG. 6, there is shown the electrical test apparatus electrical probe tip as illustrated within the schematic cross-sectional diagram of FIG. 5, where the series of replicated pointed tips 21a', 21b' and 21c' contact a bond pad or test pad 28 within a microelectronic fabrication 26.

Within the present invention the microelectronic fabrication 26 may be any of several microelectronic fabrications, including but not limited to integrated circuit microelectronic fabrications ceramic substrate microelectronic fabrications, solar cell optoelectronic microelectronic fabrications, sensor image array optoelectronic fabrications and display image array optoelectronic microelectronic fabrications.

Upon forming the electrical test apparatus electrical probe tip whose schematic cross-sectional diagram is illustrated in FIG. 5, as operated in accord with the schematic cross-sectional diagram of FIG. 6, there is provided in accord with the present invention an electrical test apparatus for electrically testing a microelectronic fabrication, wherein the microelectronic fabrication is tested with enhanced accuracy.

The preferred embodiment of the present invention realizes the foregoing object with respect to an electrical probe tip employed within the electrical test apparatus, by fabricating the electrical probe tip with a high density plasma chemical vapor deposition (HDP-CVD) deposited mandrel layer having formed therein a series of pointed tips, such that a conductor probe tip layer formed upon the high density plasma chemical vapor deposition (HDP-CVD) deposited mandrel layer replicates the series of pointed tips. In turn the series of replicated pointed tips provides for enhanced contact and enhanced accuracy when electrically testing a microelectronic fabrication while employing an electrical test apparatus having assembled therein the electrical probe tip.

As is understood by a person skilled in the art, the preferred embodiment of the present invention is illustrative of the present invention rather than limiting of the present invention. Revisions and modifications may be made to methods, materials, structures and dimensions employed for fabricating an electrical test apparatus electrical probe tip in accord with the preferred embodiment of the present invention while still providing an electrical test apparatus electrical probe tip in accord with the present invention, further in accord with the accompanying claims.

What is claimed is:

1. An electrical probe tip comprising:
   a probe tip substrate comprising a series of flat topped topographic features; and
   a mandrel layer formed upon the series of topographic features and having formed therein a series of pointed tips corresponding with the series of topographic features.

2. An electrical probe tip comprising:
   a probe tip substrate comprising a series of flat topped topographic features;
   a mandrel layer formed upon the series of topographic features and having formed therein a series of pointed tips corresponding with the series of topographic features; and
   a conductor probe tip layer formed conformally upon the mandrel layer and replicating the series of pointed tips.

3. The electrical probe lip of claim 2 wherein the series of topographic features has:
   a feature height oh from about 5000 to about 6000 angstroms;
   a feature linewidth of from about 0.8 to about 1.0 microns; and
   a feature separation of from about 3 to about 5 microns.

4. The electrical probe tip of claim 2 wherein the mandrel layer is formed of a silicon oxide dielectric material.

5. The electrical probe tip of claim 2 wherein each of the series of pointed tips has:
   an elevation height of from about 5000 to about 10000 angstroms with respect to an underlying plateau of a topographic feature centered therebeneath;
   a separation distance from an adjacent pointed tip of from about 3 to about 10 microns.

6. The electrical probe tip of claim 2 wherein the conductor probe tip layer is formed to a thickness of from about 5000 to about 10000 angstroms.

7. A method for fabricating an electrical probe tip comprising:
   providing a probe tip substrate comprising a topographic surface; and
   forming upon the topographic surface a high density plasma chemical vapor deposition deposited mandrel layer having formed therein a series of pointed tips formed over a series of topographic features within the topographic surface.

8. The method of claim 7 wherein the top graphic surface comprises a series of flat topped topographic features.

9. A method for fabricating an electrical probe tip comprising:
   providing a probe tip substrate comprising a topographic surface;
   forming upon the topographic surface a high density plasma chemical vapor deposition deposited mandrel layer having formed therein a series of pointed tips formed over a series of topographic features within time topographic surface; and
   forming conformally upon the high density plasma chemical vapor deposition deposited mandrel layer and replicating the series of pointed lips a conductor probe tip layer.

10. The method of claim 9 wherein the series of topographic features has:
    a feature height of from about 5000 to about 6000 angstroms;
    a feature linewidth of from about 0.8 to about 1.0 microns; and
    a feature separation of from about 3 to about 5 microns.

11. The method of claim 9 wherein the high density plasma, chemical vapor deposition deposited mandrel layer is harmed of a silicon oxide dielectric material.

12. The method of claim 9 wherein each of the series of pointed tips has:
    an elevation height of from about 5000 to about 10000 angstroms with respect to an underlying plateau of a topographic feature centered therebeneath;
    a separation distance from an adjacent pointed tip of from about 3 to about 10 microns.

13. The method of claim 9 wherein the conductor probe lip layer is formed to a thickness of from about 5000 to about 10000 angstroms.

14. The method of claim 9 wherein the topographic surface comprises a series of flat topped topographic features.

15. A method for electrically testing a microelectronic fabrication comprising:
    providing an electrical probe tip comprising:
       a probe tip substrate comprising a topographic surface with a series of flat topped topographic features; and
       a mandrel layer formed upon the topographic surface, the mandrel layer having formed therein a series of pointed tips formed over the series of topographic features within the topographic surface; and
    contacting a microelectronic lubrication with the electrical probe tip.

16. A method for electrically testing a microelectronic fabrication comprising:
    providing an electrical probe tip comprising:
       a probe tip substrate comprising a topographic surface with a series of flat topped topographic features;
       a mandrel layer formed upon the topographic surface, the mandrel layer having formed therein a series of pointed tips formed over the series of topographic features within the topographic surface; and
       a conductor probe tip layer formed conformally upon the mandrel layer and replicating the series of pointed tips; and
    contacting a microelectronic fabrication with the electrical probe tip.

17. The method of claim 16 wherein the series of topographic features has:
    a feature height of from about 5000 to about 6000 angstroms;
    a feature linewidth of from about 0.8 to about 1.0 microns; and
    a feature separation of from about 3 to about 5 microns.

18. The method of claim 16 wherein the mandrel layer is formed of a silicon oxide dielectric material.

19. The method of claim 16 wherein each of the series of pointed tips has:
    an elevation height of from about 5000 to about 10000 angstroms with respect to an underlying plateau of a topographic feature centered therebeneath;
    a separation distance from an adjacent pointed tip of from about 3 to about 10 microns.

20. The method of claim 16 wherein the conductor probe tip layer is formed to a thickness of from about 5000 to about 10000 angstroms.

21. An electrical probe tip comprising:
    a probe tip substrate comprising a series of flat topped topographic features and having a conductor bus layer embedded therein;

a mandrel layer formed upon the series of topographic features and having formed therein; a series of pointed tips corresponding with the series of topographic features; and a conductor probe tip layer formed conformally upon the mandrel layer and replicating the series of pointed tips.

22. A method for fabricating an electrical probe tip comprising:

providing a probe tip substrate comprising a topographic surface and having a conductor bus layer embedded therein;

forming upon the topographic surface a high density plasma chemical vapor deposition deposited mandrel layer having formed therein a series of pointed tips formed over a series of topographic features within the topographic surface; and forming conformally upon the high density plasma chemical vapor deposition deposited mandrel layer and replicating the series of pointed tips a conductor probe tip layer.

23. A method for electrically testing a microelectronic fabrication comprising:

providing an electrical probe tip comprising:

a probe tip substrate comprising a topographic surface with a series of flat topped topographic features and having a conductor bus layer embedded therein;

a mandrel layer formed upon the topographic surface, the mandrel layer having formed therein a series of pointed tips formed over the series of topographic features within the topographic surface; and a conductor probe tip layer formed conformally upon the mandrel layer and replicating the series of pointed tips; and contacting a microelectronic fabrication with the electrical probe tip.

* * * * *